United States Patent
Rudosky et al.

(10) Patent No.: US 7,331,013 B2
(45) Date of Patent: Feb. 12, 2008

(54) VITERBI DECODER WITH SURVIVOR BITS STORED TO SUPPORT LOOK-AHEAD ADDRESSING

(75) Inventors: John M. Rudosky, Portsmouth, NH (US); Brian Box, Seabrook, NH (US); Sharad Sambhwani, San Diego, CA (US); Aixin Liu, San Diego, CA (US)

(73) Assignee: NVIDIA Corporation, Santa Clara, CA (US)

( * ) Notice: Subject to any disclaimer, the term of this patent is extended or adjusted under 35 U.S.C. 154(b) by 696 days.

(21) Appl. No.: 10/784,484

(22) Filed: Feb. 18, 2004

(65) Prior Publication Data

US 2005/0182999 A1    Aug. 18, 2005

(51) Int. Cl.
*H03M 13/41* (2006.01)
(52) U.S. Cl. ..................................... 714/795
(58) Field of Classification Search ............... 714/795
See application file for complete search history.

(56) References Cited

U.S. PATENT DOCUMENTS

| | | | | |
|---|---|---|---|---|
| 5,987,637 A | * | 11/1999 | Thomas | 714/795 |
| 6,094,739 A | * | 7/2000 | Miller et al. | 714/792 |
| 6,901,118 B2 | * | 5/2005 | Hocevar et al. | 375/341 |
| 7,035,356 B1 | * | 4/2006 | Langhammer | 375/341 |
| 2004/0064781 A1 | * | 4/2004 | Kamada | 714/795 |
| 2004/0243916 A1 | * | 12/2004 | Kim et al. | 714/796 |

OTHER PUBLICATIONS

George C. Clark, Jr., and J. Bibb Cain, Error Correction Coding for Digital Communications, Plenum Press, New York, 1981.
Hekstra, Andries P., "An Alternative to Metric Rescaling in Viterbi Decoders", IEEE Transactions on Communications, vol. 37, No. 11, Nov. 1989.
E. Yeo, S. Augsburger, W. R. Davis, and B. Nikolic, "Implementation of High Throughput Soft Output Viterbi Decoders," Proc. IEEE Workshop on Signal Processing Systems,, pp. 146-151, San Diego, CA, Oct. 16-18, 2002.

(Continued)

*Primary Examiner*—Stephen M. Baker
(74) *Attorney, Agent, or Firm*—Patterson & Sheridan, LLP

(57) ABSTRACT

In accordance with an embodiment of the present invention, a Viterbi decoder is described that operates on convolutional error correcting codes. The decoder allows for a pipelined architecture and a unique partitioning of survivor memory to maintain data integrity. Throughput rate is improved and stalling minimized by accessing memory words using a look-ahead function to fill the pipeline.

34 Claims, 9 Drawing Sheets

OTHER PUBLICATIONS

M. Bickerstaff, et al., "A Unified Turbo/Viterbi Channel Decoder for 3GPP Mobile Wireless in 0.18□m CMOS", in IEEE Journal of Solid-state Circuits, vol. 37, No. 11, Nov. 2002 pp. 1555-1562.

A. Matache, R. D. Wesel, Jun Shi, "Trellis Coding for Diagonally Layered Space-Time Systems".

D. Garrett, M. Stan, "Low Power Architecture of the Soft-Output Viterbi Algorithm".

Jong Min Kim, Nan Jin Park, "Implementation of Convolutional Encoder and Viterbi Decoder for Wideband CDMA PCS Baseband Processing Unit Using Multiple TMS320C40s".

I. Bogdan, M. Munteanu, P.A. Ivey, N. L. Seed, N. Powell, "Power Reduction Techniques for a Viterbi Decoder Implementation".

E. Paaske, J. D. Andersen, "High Speed Viterbi Decoder Architecture", First ESA Workshop on Tracking, Telemetry and Command Systems, ESTEC, Jun. 1998.

Yun-Nan Chang, Keshab K. Parhi, Hiroshi Suzuki, "Low-power Bit-serial Viterbi Decoder for Next Generation Wide-band CDMA Systems".

H. Hendrix, "Viterbi Decoding Techniques in the TMS320C54x Family", Texas Instruments Application Note, Jun. 1996.

* cited by examiner

K = 7 Memory Organization

| Bit# | Word0 | Word1 | Bit# | Word0 | Word1 |
|---|---|---|---|---|---|
| 0 | 0 | 16 | 16 | 32 | 48 |
| 1 | 1 | 17 | 17 | 33 | 49 |
| 2 | 2 | 18 | 18 | 34 | 50 |
| 3 | 3 | 19 | 19 | 35 | 51 |
| 4 | 4 | 20 | 20 | 36 | 52 |
| 5 | 5 | 21 | 21 | 37 | 53 |
| 6 | 6 | 22 | 22 | 38 | 54 |
| 7 | 7 | 23 | 23 | 39 | 55 |
| 8 | 8 | 24 | 24 | 40 | 56 |
| 9 | 9 | 25 | 25 | 41 | 57 |
| 10 | 10 | 26 | 26 | 42 | 58 |
| 11 | 11 | 27 | 27 | 43 | 59 |
| 12 | 12 | 28 | 28 | 44 | 60 |
| 13 | 13 | 29 | 29 | 45 | 61 |
| 14 | 14 | 30 | 30 | 46 | 62 |
| 15 | 15 | 31 | 31 | 47 | 63 |

K = 7 Memory Organization

| Bit# | Word0 | Word1 |
|---|---|---|
| 0 | 0 | 1 |
| 1 | 32 | 33 |
| 2 | 16 | 17 |
| 3 | 48 | 49 |
| 4 | 8 | 9 |
| 5 | 40 | 41 |
| 6 | 24 | 25 |
| 7 | 56 | 57 |
| 8 | 4 | 5 |
| 9 | 36 | 37 |
| 10 | 20 | 21 |
| 11 | 52 | 53 |
| 12 | 12 | 13 |
| 13 | 44 | 45 |
| 14 | 28 | 29 |
| 15 | 60 | 61 |
| 16 | 2 | 3 |
| 17 | 34 | 35 |
| 18 | 18 | 19 |
| 19 | 50 | 51 |
| 20 | 10 | 11 |
| 21 | 42 | 43 |
| 22 | 26 | 27 |
| 23 | 58 | 59 |
| 24 | 6 | 7 |
| 25 | 38 | 39 |
| 26 | 22 | 23 |
| 27 | 54 | 55 |
| 28 | 14 | 15 |
| 29 | 46 | 47 |
| 30 | 30 | 31 |
| 31 | 62 | 63 |

FIGURE 9

K = 9 Memory Organization

| Bit# | W0 | W1 | W2 | W3 | W4 | W5 | W6 | W7 |
|---|---|---|---|---|---|---|---|---|
| 0 | 0 | 4 | 2 | 6 | 1 | 5 | 3 | 7 |
| 1 | 128 | 132 | 130 | 134 | 129 | 133 | 131 | 135 |
| 2 | 64 | 68 | 66 | 70 | 65 | 69 | 67 | 71 |
| 3 | 192 | 196 | 194 | 198 | 193 | 197 | 195 | 199 |
| 4 | 32 | 36 | 34 | 38 | 33 | 37 | 35 | 39 |
| 5 | 160 | 164 | 162 | 166 | 161 | 165 | 163 | 167 |
| 6 | 96 | 100 | 98 | 102 | 97 | 101 | 99 | 103 |
| 7 | 224 | 228 | 226 | 230 | 225 | 229 | 227 | 231 |
| 8 | 16 | 20 | 18 | 22 | 17 | 21 | 19 | 23 |
| 9 | 144 | 148 | 146 | 150 | 145 | 149 | 147 | 151 |
| 10 | 80 | 84 | 82 | 86 | 81 | 85 | 83 | 87 |
| 11 | 208 | 212 | 210 | 214 | 209 | 213 | 211 | 215 |
| 12 | 48 | 52 | 50 | 54 | 49 | 53 | 51 | 55 |
| 13 | 176 | 180 | 178 | 182 | 177 | 181 | 179 | 183 |
| 14 | 112 | 116 | 114 | 118 | 113 | 117 | 115 | 119 |
| 15 | 240 | 244 | 242 | 246 | 241 | 245 | 243 | 247 |
| 16 | 8 | 12 | 10 | 14 | 9 | 13 | 11 | 15 |
| 17 | 136 | 140 | 138 | 142 | 137 | 141 | 139 | 143 |
| 18 | 72 | 76 | 74 | 78 | 73 | 77 | 75 | 79 |
| 19 | 200 | 204 | 202 | 206 | 201 | 205 | 203 | 207 |
| 20 | 40 | 44 | 42 | 46 | 41 | 45 | 43 | 47 |
| 21 | 168 | 172 | 170 | 174 | 169 | 173 | 171 | 175 |
| 22 | 104 | 108 | 106 | 110 | 105 | 109 | 107 | 111 |
| 23 | 232 | 236 | 234 | 238 | 233 | 237 | 235 | 239 |
| 24 | 24 | 28 | 26 | 30 | 25 | 29 | 27 | 31 |
| 25 | 152 | 156 | 154 | 158 | 153 | 157 | 155 | 159 |
| 26 | 88 | 92 | 90 | 94 | 89 | 93 | 91 | 95 |
| 27 | 216 | 220 | 218 | 222 | 217 | 221 | 219 | 223 |
| 28 | 56 | 60 | 58 | 62 | 57 | 61 | 59 | 63 |
| 29 | 184 | 188 | 186 | 190 | 185 | 189 | 187 | 191 |
| 30 | 120 | 124 | 122 | 126 | 121 | 125 | 123 | 127 |
| 31 | 248 | 252 | 250 | 254 | 249 | 253 | 251 | 255 |

FIGURE 10

VITERBI DECODER WITH SURVIVOR BITS STORED TO SUPPORT LOOK-AHEAD ADDRESSING

CROSS-REFERENCES TO RELATED APPLICATIONS

The present application is related to commonly assigned U.S. patent application Ser. No. 10/683,563 now U.S. Pat. No. 7,197,686, entitled "RECONFIGURABLE BIT-MANIPULATION NODE" filed on Oct. 10, 2003, the disclosure of which is hereby incorporated by reference in its entirety for all purposes.

BACKGROUND OF THE INVENTION

The present invention generally relates to a method for decoding convolutional codes and, more specifically, to a system and method for decoding convolutional error correcting codes using a maximum-likelihood decoding algorithm.

Error correcting codes are well known. Early codes included parity codes and block codes where syndromes are generated to help determine whether the received data stream at a receiving device is the same as the data stream that was sent by a transmitting device. Parity codes operate at the byte or word level while block codes operated on relatively large (typically, up to a couple of hundred bytes) message blocks. Recently, convolutional codes have enjoyed increasing popularity in both magnetic recording applications and communication systems, such as optical, wireline and wireless communication systems. In contrast to block codes, convolutional codes operate on serial data, one or a few bits at a time. The Viterbi algorithm is a widely used convolutional code decoding algorithm and is of the type known as a maximum-likelihood decoding algorithm.

In a typical system requiring forward error correction, the transmitting device uses an encoder to encode a stream of data before transmission through the channel in accordance with certain key parameters. Specifically, a constraint length (denoted as 'k'), a code rate (denoted as r='number in' divided by 'number out') and generator polynomials (denoted g0, g1, . . . g(#out−1) are defined and implemented by the encoder to encode the data stream. The encoded data stream also includes inserted redundant symbols that are generated based on the data stream. Convolutional encoders are well known in the art.

The convolutional encoder employs an algorithmic method to generate an encoded output stream that is based on the current input and a selected number of previous inputs to the encoder. The convolutional encoder may be described using a code tree with each digital input specifying a branch on the tree. In the tree view, each symbol (zero or one) drives the encoder to a different state.

After transmission of the encoded data stream to the receiving device, a decoder process operates on the encoded data stream to recover the original data stream from the encoded data stream. The decoder determines the original inputs to the encoder by exploiting the trellis structure of the code to determine the maximum likelihood path through the tree given the received sequence. More specifically, based upon the encoded input data, the constraint length (k) and the generator polynomials, a cost or path metric is computed for each possible branch of the tree diagram for the given decoder sample. The path-metric is the cost of traversing the tree to the current point. The computed branch-metric is then added to an accumulated path metric. The lower cost updated path for a given state is selected and stored as a selection bit. This selection bit is used by path-metric comparison logic to specify which of the two possible paths is more likely.

For each input sample, the cost at each node of the tree is computed and the lower cost path is chosen as a survivor. The selection bit for each of the nodes is stored in the survivor memory at a specific location based upon which node was being computed. By storing the selection bits in the survivor memory, a history of the most likely transitions into every given state for each input sample is retained. Once enough data is stored in the survivor memory, the output stage is activated. Although there are a number of different methods to recover the data stream from the survivor data. One of the most common techniques used for the recovery is the trace-back method. In the trace-back method, the stored survivor data corresponds to the tree connections computed by the decoder. Starting from the latest data point, the path through the code tree is reconstructed in reverse order so that the last bit out of trace-back corresponds to the very first data bit input to the encoder. Due to inherent properties of the convolutional code, the survivor data eventually merges to the maximum likelihood sequence of inputs. The number of samples required for this merging is called the convergence interval of the decoder. The traced back sequence after the convergence interval is the time reversed input sequence.

The trace-back process requires a large number of computations. These computations require many clock cycles and can result in stalls, delays, dropouts or interruption in delivering the received data stream to the user. Further, the trace-back process may be delayed by the hardware used to implement the Viterbi decode process because of setup and hold time requirements and computational overhead, such as the time to complete a double word memory access. Clearly, what is needed is an efficient trace-back process that minimizes the occurrence of delays, dropouts or interruptions.

To achieve high throughput rates in spite of the above described technical limitations, the current literature describes the use of a "fully unrolled and pipelined architecture." See, for example, Engline Yeo et al., *A 500-Mb/s Soft-Output Viterbi Decoder*, IEEE Journal of Solid-State Circuits, Vol. 38, No. 7, July 2003. However, as reported in this article, the complexity, power consumption and circuit area are all increased when a pipelined architecture is used.

Moreover, the insertion of pipeline stages along the survivor selection path requires careful management of the next survivor bit selection logic. If the survivor memory used is actually $2^{(k-1)}+1$ bits wide then it is sufficient to pipeline adjust the multiplexor selector signal so that it lines up with the appropriate data word. However, in the case where the survivor bits are distributed across multiple memory words, the memory read address must also be adjusted to account for the data pipeline. Like the selector, the read address may be delayed to equalize the pipeline skew. Delaying the memory read address results in lowered performance of the trace-back phase reducing the output rate.

Another classical approach to the problem of pipeline skew and system stalls suggests that "[d]ue to the non-causality of this method, the memory trace-back method faces imminent pipeline stalls." See E. Yeo, et al., *Implementation of High Throughput Soft Output Viterbi Decoders*, Proc. IEEE Workshop on Signal Processing Systems, pp. 146-151, San Diego, Calif., Oct. 16-18, 2002. Obviously, system stalling will have adverse effects on the system throughput.

What is needed is a system and method for implementing a pipelined architecture that substantially eliminates the possibility of stalls or delays without increasing power consumption or circuit area and that does not increase the complexity of the trace-back process.

SUMMARY OF EMBODIMENTS OF THE INVENTION

In accordance with an embodiment of the present invention, an error correcting system and method for decoding convolutional codes is provided. More specifically, an efficient and novel method is disclosed for decoding convolutionally encoded data using a maximum-likelihood decoding algorithm. In one preferred embodiment, received encoded data is decoded by a Viterbi decoder that incorporates a pipelined architecture to improve the throughput rate of the Viterbi decoder. Advantageously, the decoder is not susceptible to stalls, delays, dropouts or interruption in delivering the decoded received data stream to the user. The present invention provides a simple yet elegant solution to implementing a pipelined trace-back solution for a Viterbi decoder that not only eliminates possibility of stalls or delays but that also overcomes hardware limitations inherent in a pipeline architecture while providing a high performance communication system.

The present invention uses the trace-back process to recover the input sequence from survivor data. The trace-back process exploits properties of the code and survivor selection logic to retrace the path through the code tree. By retracing the computed best path through the code tree the decoder reconstructs the transmitted data stream correcting any transmission errors that may have been inserted during the transmission process so that, with a large enough survivor data set, the correct sequence is converged upon. Due to inherent properties of the convolutional code, survivor data eventually merges to the maximum likelihood sequence of inputs corresponding to the un-encoded input stream. The number of samples required for this merging is called the convergence interval of the decoder. The traced-back sequence after the convergence interval is the time reversed data stream.

Data throughput and integrity is maintained in the presence of survivor path pipelining by exploiting certain properties of the code tree. Specifically, since each state can only exit to one of two other states or be entered from one of two other states regardless of the complete path to that state, the code tree actually wraps back upon itself. Furthermore, from any arbitrary starting state the same ordered set of possible end states is reached after k−1 iterations due to the nature of the code tree. Importantly, once a branch is taken, a set of states is no longer valid and only a limited subsection of the tree is valid. Accordingly, it is possible to account for the pipeline delay by organizing the survivor storage in accordance with certain properties of the code tree. Partitioning the memory in accordance with the present invention results in no throughput degradation while maintaining data integrity.

In accordance with an embodiment of the present invention, a convolutional encoding method generates outputs of an encoder by convolving the input bits of a data stream with itself to add a level of dependence on past values. The encoding process creates a constrained tree structure that is used by a Viterbi decoder to recover the input bits of the data stream. The Viterbi decoder of the present invention incorporates a pipelined architecture and novel final state ordering to improve the throughput rate and to compensate for hardware operating delays associated with the decoder.

These provisions together with the various ancillary provisions and features which will become apparent to those artisans possessing skill in the art as the following description proceeds are attained by devices, assemblies, systems and methods of embodiments of the present invention, various embodiments thereof being shown with reference to the accompanying drawings, by way of example only and not by way of any limitation, wherein:

BRIEF DESCRIPTION OF THE DRAWINGS

FIG. 9 illustrates a memory organization for a k=7 Viterbi decoder in accordance with an embodiment of the present invention.

FIG. 10 illustrates a memory organization for a k=9 Viterbi decoder in accordance with an embodiment of the present invention.

DETAILED DESCRIPTION OF EMBODIMENTS OF THE INVENTION

In the description herein for embodiments of the present invention, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

Also, in the description herein for embodiments of the present invention, a portion of the disclosure recited in the specification contains material that is subject to copyright protection. Computer program source code, object code, instructions, text or other functional information that is executable by a machine may be included in an appendix, tables, Figures or in other forms. The copyright owner has no objection to the facsimile reproduction of the specification as filed in the Patent and Trademark Office. Otherwise, all copyright rights are reserved.

In accordance with an embodiment of the present invention, a convolutional encoding method generates outputs of an encoder by convolving the input bits of a data stream with itself to add a level of dependence on past values. The encoding process creates a constrained tree structure that is used by a Viterbi decoder to recover the input bits of the data stream. The Viterbi decoder of the present invention incorporates a pipelined architecture to improve the throughput rate and to compensate for hardware operating delays associated with the decoder.

Figure 1:
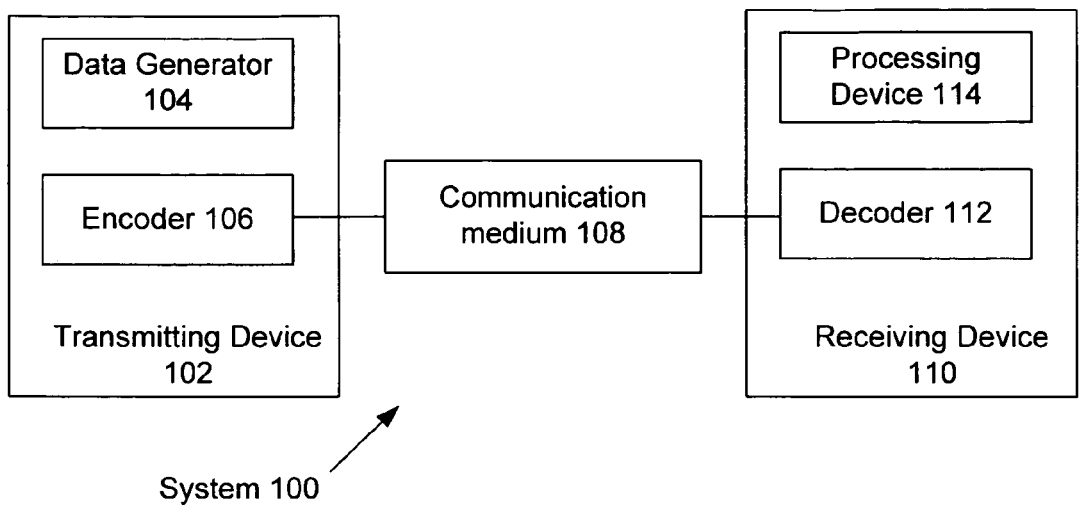
FIG. 1 a simplified block diagram illustrating one exemplary embodiment of a data system for transmitting and decoding encoded data in accordance with the present invention.

Referring now to the drawings more particularly by reference numbers, a data system 100 is illustrated in FIG. 1. Specifically, a transmitting device 102 includes a data generator 104 that provides a data stream to an encoder 106. The encoder is preferably a convolutional encoder having, by way of example, a constraint length of 7 or 9. The output of encoder 106 comprises an encoded data stream that is transmitted across a communication medium 108 to a receiving device 110. Communication medium is not restricted and includes communication signals sent over a wire or electrical cable, radio transmission, cellular telephone transmissions, deep space transmissions and the like.

Receiving device 110 comprises a decoder 112 that is adapted to receive the encoded data stream and generate the actual data sequence of the data stream. The data stream is then processed in accordance with the functions of the processing device 114.

Figure 2:
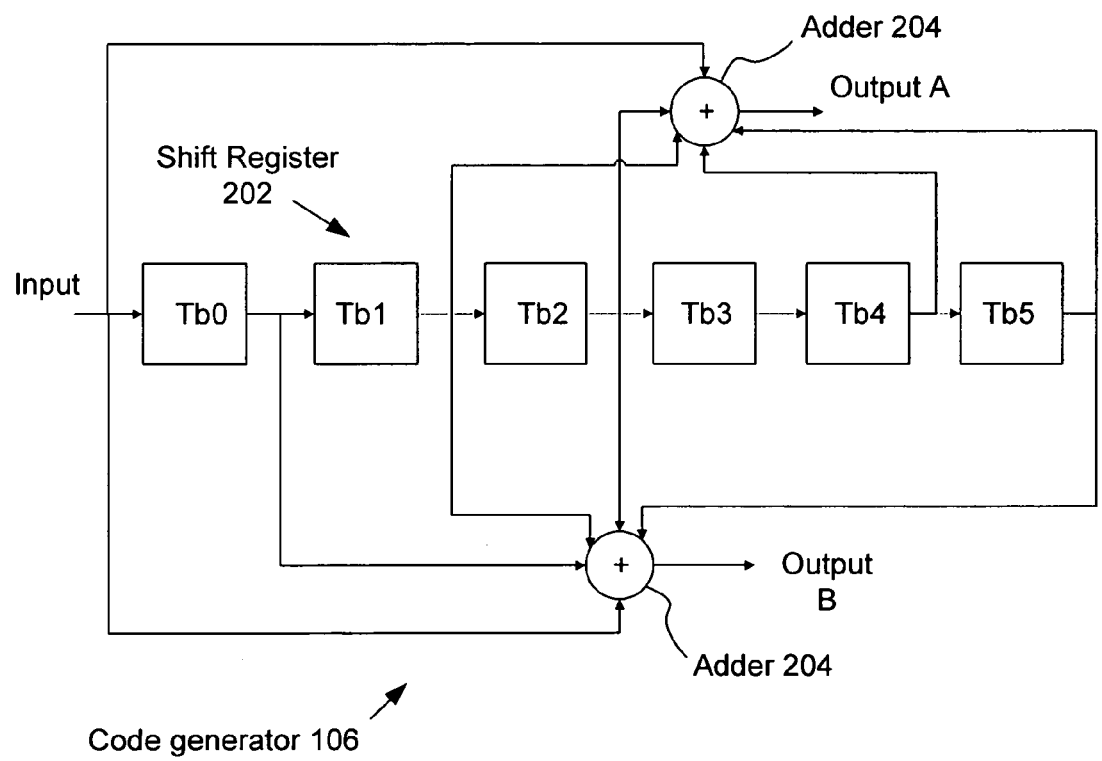
FIG. 2 is a block diagram of a prior art encoder.

An exemplary convolutional encoder 106, illustrated in FIG. 2, has a constraint length, k, where k=7 a code rate, r, where is r=½, and two polynomials that are $g_0=133|_8$ and $g_1=171|_8$ which correspond to the shift register connections to the lower and upper modulo-two adders, respectively. In this embodiment, there are six delays and the constraint length is seven, which represents the total span of values used and is determined regardless of the number of taps used to form the code words. The constraint length implies many system properties; most importantly, it indicates the number of possible delay states. Error correction is dependent on the number of past samples that form the code symbols. The number of input bits used in the encoding process is the constraint length and is calculated as the number of unit delays plus one. Thus, in encoder 106, the bits of an input data stream are delayed by k−1 samples.

For each input bit, two output bits are generated, multiplexed together to form serial stream and transmitted to the decoder 112 of receiving device 110. Prior to transmission, the encoder may further process the encoded data stream using a technique commonly referred to as puncturing, which is a procedure for omitting certain encoded bits in the transmitter, to achieve higher code rates. Such techniques are well known in the art and the decision to include the puncturing procedure is considered an engineering decision that is dependant on the application.

Further, although the present invention is described in terms of an encoder having a constraint length of seven, the present invention is not limited to any particular code rate and other constraint lengths are known and may be readily implemented. For example, the constraint length could be three, five, nine (k=3, k=5 or k=9) or some other length, it being understood that the constraint length is an engineering selection that may be dictated by the application.

FIG. 2 illustrates encoder 106 in more detail. Specifically, encoder includes a shift register 202, a first modulo-two adder 204 and a second modulo-two adder 206. In operation, the content of each position in the shift register is initially cleared, i.e. all register outputs are zero, in accordance with standard convention. Then, at time $t_0$, an input bit is initially shifted into the first shift register position, Tb0. At time $t_1$, the bit in register position Tb0 is shifted to position Tb1 and another input bit is shifted into position Tb0 and so on until the seventh bit is stable at the input of shift register position Tb0. Mathematically, shifting the input of the bit stream into the shift register changes the state of the encoder system because the state is determined by the value of the shift register.

Figure 3:
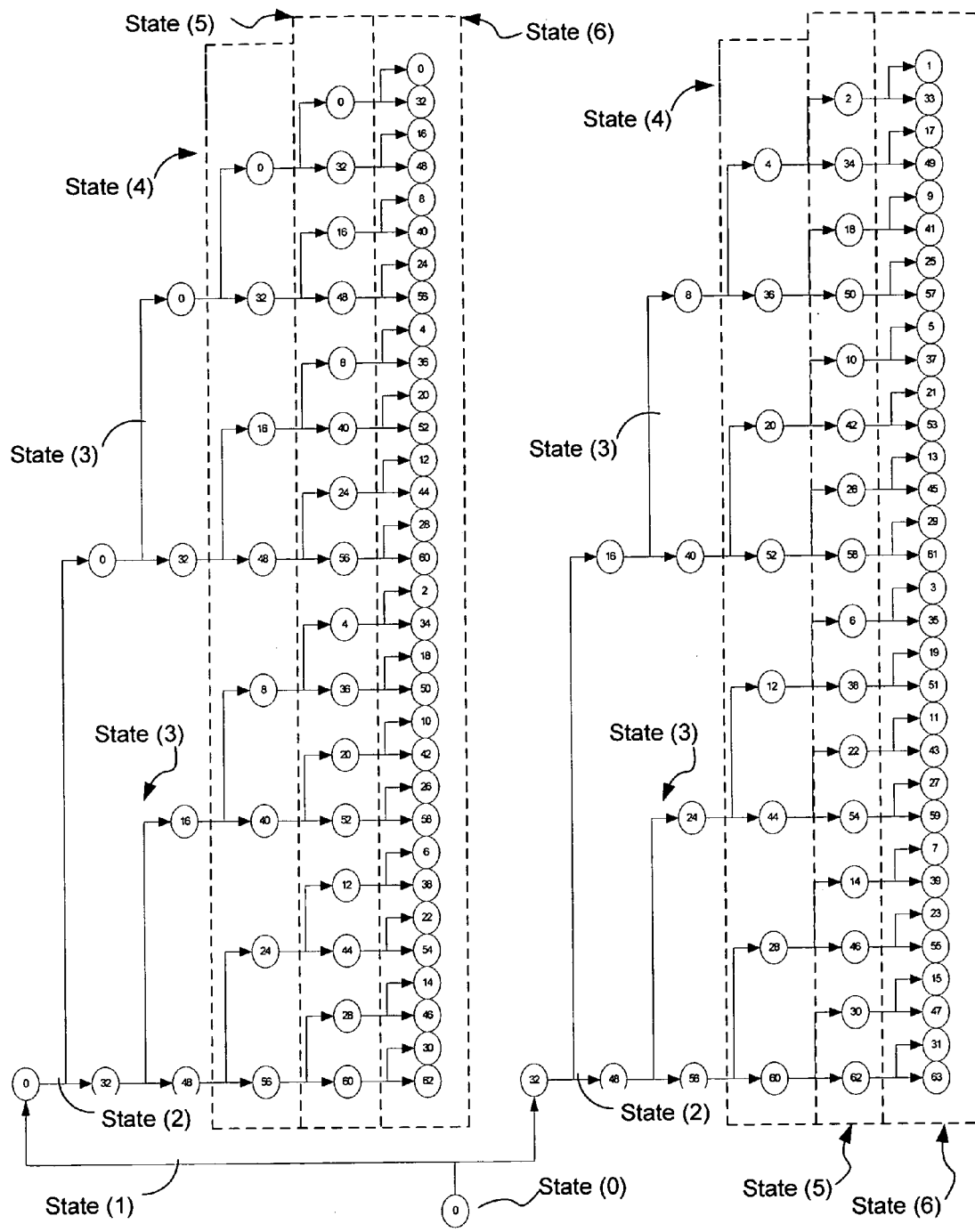
FIG. 3 is a code tree in accordance with an embodiment of the present invention.

FIG. 3 illustrates a tree representing the allowable state transitions for an input data stream wherein convolutionally encoded data is decoded through knowledge of the possible state transitions created from the dependence of the current symbol on past data. To illustrate the progression through the tree, let the encoder state at time t be denoted by state(t), which is not to be confused with the actual state value. Assume that at an initial state (i.e., state (0)), the shift register has been previously initialized with all zeros at each register location and a first input bit is shifted into location Tb0 (FIG. 2). This input bit may be either a '0' or a '1'. In the case where the input bit is a '0', then for the next state, state (1), the shift register will still have the value of '0'. If, however, the input bit is a '1', then for state (1), the value of the shift register will be 32. When the next input bit is shifted into the shift register, the first bit will be shifted to Tb1 and a new bit shifted into register Tb0.

For the case where the first bit of the input bit stream is a '0', state (1) follows the tree path to the left side and also has a value of '0'. If the second bit is a '1', then state (2) will have a value of '32' but if the bit was a '0' then state (2) will have a value of '0'. Similarly, if the third bit is a '1', the state may have one of four possible values (i.e., '48', '16', '32' or '0') as indicated at state (3). As the remaining bits are each shifted into the shift register, the value traverses the tree until a series of output values are generated from each bit and the following or trailing six bits of the input data stream. The process continues until the end of the input data frame, which may or may not be terminated with a specific pattern. The frame size and termination pattern are functions of the system design and preferences of the designers. Each bubble on the tree represents a change in the state value. While the code tree is typically displayed as a trellis to highlight the bound nature of the code at $2^{K-1}$ or 64 states in the case of a k=7 code, the tree structure is actually preferred for purposes of this invention.

A Viterbi decoder uses an algorithm that obtains a maximum likelihood sequence estimate (MLSE) from a convolutionally encoded received data stream. The Viterbi decoder typically is based upon certain parameters referred to as the trace-back length (TL), the decoding length (DL) and the convergence length (CL) where the relationship between these parameters is:

$$TL=DL+CL \qquad (1)$$

Typically, the convergence length is related to the constraint length by:

$$CL=5*k \qquad (2)$$

where k is the constraint length of the encoder. However, for punctured codes, a setting of CL=10*k may be more appropriate. The algorithm first obtains a Trellis diagram of convolutional encoder that originated the encoded data stream. The number of states in the trellis is:

$$N=2^{(k-1)} \qquad (3)$$

where k is the constraint length of the encoder. If k=7, then N=64. For each output bit or stage, the decoder will perform N/2 forward butterfly (1 Butterfly=2 Add Compare Select) computations with the results being the survivor path bits for each state in that stage. Each butterfly operation results in the update of the path metrics of a pair of states and the generation of a pair of survivor bits. Once the butterflies computations corresponding to TL stages is completed, the algorithm then performs a trace-back operation, resulting in decoding of DL bits. The process is repeated until all bits in the block have been decoded.

Figure 4:
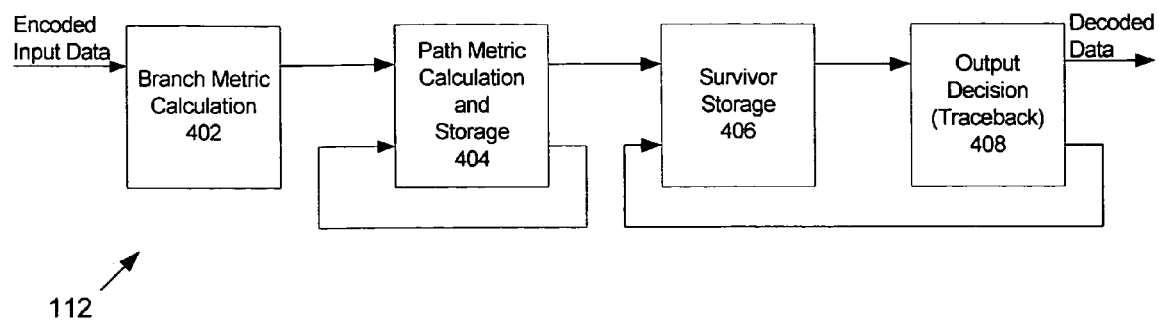
FIG. 4 illustrates a Viterbi decoder in accordance with an embodiment of the present invention.

FIG. 4 is a block diagram of a Viterbi convolutional code decoder 112. Decoder 112 includes a branch metric calculation module 402 that accepts encoded input data streams. Module 402 computes a cost, based upon the encoded input data, the constraint length (k) and the generator polynomials, for each possible branch of the tree diagram for the encoded input data stream. The branch metrics represent the cost of traversing along a specific branch. As the calculations are completed, the computed cost is passed to a path metric calculation module 404.

Module 404 includes comparison logic and a storage memory for storing computed path metric calculations. The state metrics, or path metrics, accumulate the minimum cost of 'arriving' into a specific state. The algorithm states are updated using an add-compare-select recursion, which are well known in the art. The branch metrics are added to the path metrics of the previous time instant. The smaller one of the two is selected to be the new state metric for each state. Module 404 receives the computed branch-metric, which is added to an accumulated path metric value. The path metric represents the cost of traversing the tree to the current point. The lowest cost updated path for a given state is selected and stored. The path metric comparison also results in the generation of a selection bit for each node of the tree.

The details of the operation of the branch metric calculation module 402 and path metric calculation module 404 are not specifically shown nor described in detail because the mechanics of how such modules operate are not germane to the present invention. Rather, the present invention relates to the further processing of the selection bits once the path metric calculations are complete.

Figure 5:
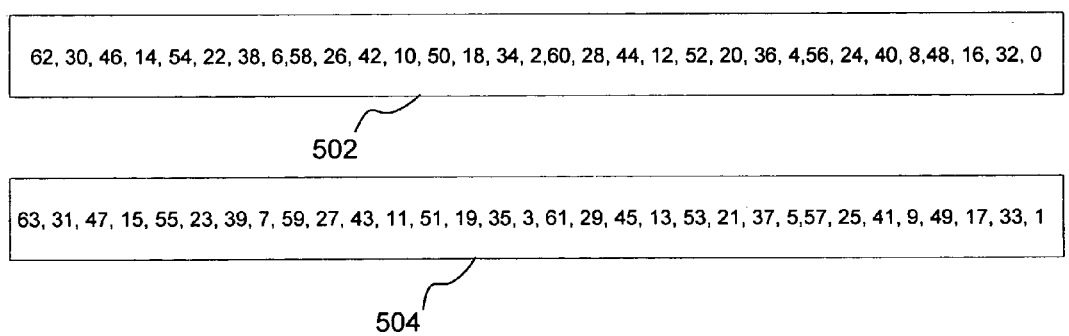
FIG. 5 illustrates storage of survivor bits in accordance with an embodiment of the present invention.

The selection bits are stored in survivor storage 406 at a specific location based upon which node the selection bit was computed for. As the selection bits, which are also referred to as survivor bits, are stored, a history of the most likely transitions into every given state for each input sample is created in survivor storage 406. The survivor bit information that is stored in trace-back memory does not represent the actual input bit but rather represents one of two possible paths that was the survivor. A value of '1' in any bit position indicates that the previous state lies along the upper path of the tree, and a '0' indicates the previous state is the other path. In this way the survivor bit actually traces the state transitions through the system. The trace-back operation is actually a sliding window on the tree diagram of FIG. 3. A survivor bit value of '1' specifies traversal down the lower branch out of a state and due to the end state distribution this also indicates if the state in k−1 iterations is necessarily even or odd. It is thus possible to take advantage of the even/odd property of the tree by grouping survivor bit storage at every tree stage in memory into even and odd words following the end state distribution. More specifically, the survivor bits for all of the 32 even states are stored in even addressed 32-bit word 502 and the survivor bits for all the 32 odd states are stored in odd addressed word 504 as illustrated in FIG. 5.

Referring again to FIG. 4, when a sufficient history is accumulated in survivor storage 406, the output decision module 408 accesses the survivor bits in survivor storage 406 in a time-reversed manner during a trace-back process. The output decision module 408 implements a trace-back function as well as general data routing and reordering.

Figure 6A:
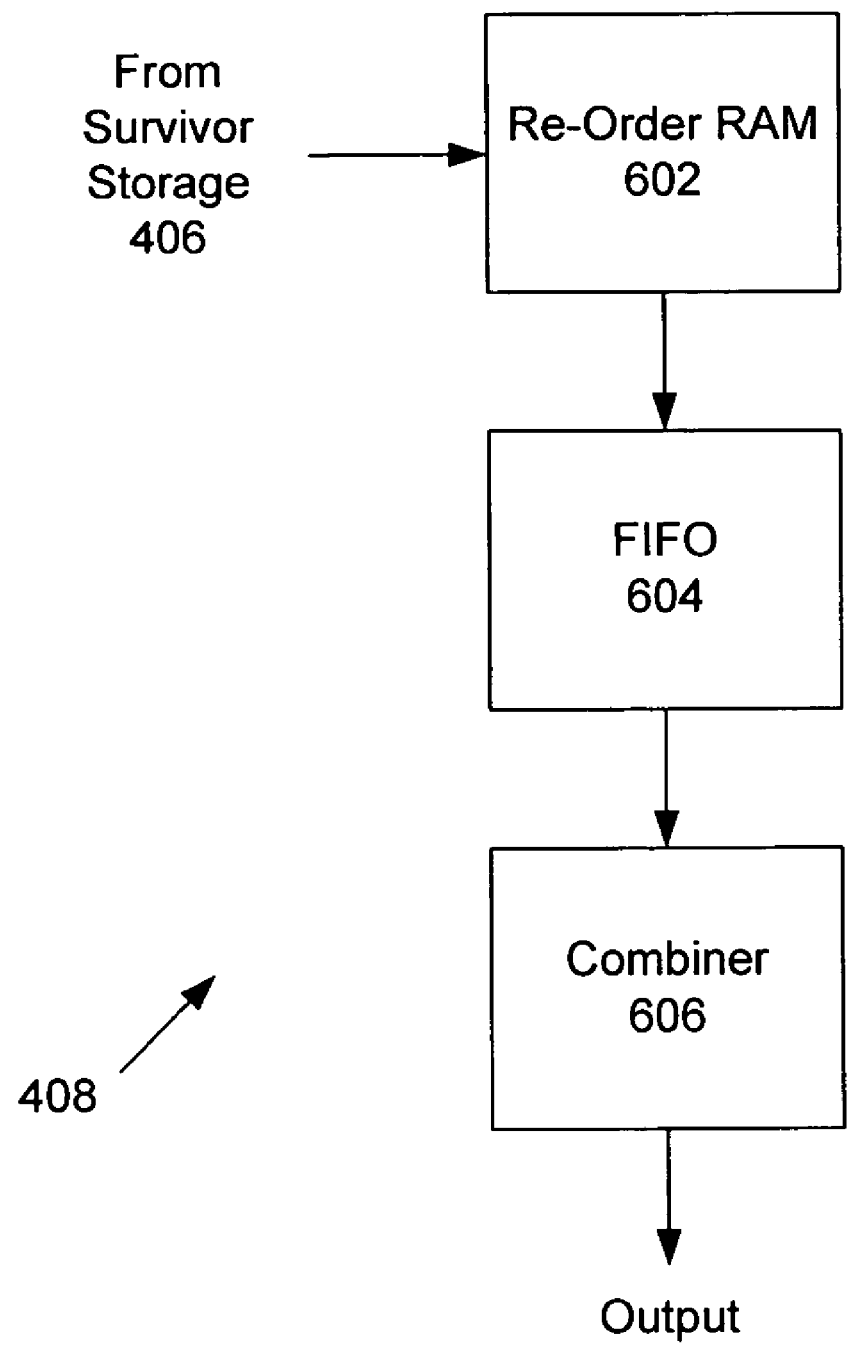
FIG. 6A illustrates a trace-back module in a Viterbi decoder in accordance with an embodiment of the present invention.

As shown in FIG. 6A, module 408 includes reorder RAM read port 602, which receives data from survivor memory 506, FIFO module 604, and combiner 606 module. These components are associated with reformatting and routing the trace-back output stream. In operation, the trace-back/decoding process extracts a trace bit from the accessed memory word. This trace-bit is selected from the survivor bit word and represents the path to the previous state in the survivor path but does not represent the decoded bit. The trace bit is also used to determine the address computation of the survivor word 4 cycles later. More importantly, the trace-bit determines whether the address that will be computed 4 cycles later is an even or odd state. The least significant bit (LSB) of the computed address represents the decoded bit. Finally, when all bits are decoded, corresponding to a programmable decoding length, the data is sent to the Combiner/Filler from the Last In First Out (LIFO) so that the last register that was written is read out first into the Combiner Filler.

The trace-back process computes the most likely path through the code tree. Advantageously, regardless of the constraint length used in a particular application, the correspondence between data values and states allows easy data reconstruction once the path through the tree is determined. In the trace-back process, stored survivor bits represent the tree connections computed by modules 403 and 404. Starting from the latest data point, the path through the code tree is reconstructed in reverse order such that the last bit out of the trace-back process corresponds to the very first data bit input to the encoder. Due to inherent properties of convolutional code, the survivor bits eventually merge to the maximum likelihood sequence of inputs such that the traced back sequence after the convergence interval is the time reversed input sequence.

In the ideal decoder, the survivor memory would be 64 bits wide (for a k=7 code) to provide for all possible sample states. The survivor bit actually helps to trace-back the states because as the path is traversed and an even state occurs in the path, then the decoded bit has to be a "0", irrespective of it's previous state, while if an odd state occurs in the path, then the decoded bit has to be a "1". This property is exploited, in the present embodiment, by grouping the sample states into two 32-bit wide words such as illustrated in FIG. 5. Advantageously, the even/odd property of the tree structure permits an arrangement of the survivor bit storage for every tree stage in memory that permits the bits to be arranged in even and odd words. In this embodiment, the survivor bits for the thirty-two even states for each sample are stored in even addressed 32-bit words and the survivor bits for the thirty-two odd states are stored in odd addressed 32-bit words.

Unfortunately, when the memory is not 64-bits wide (for a k=7 code), it is difficult to access memory fast enough to meet the setup and hold time of the trace-back module 408. Further, routing delays and integrated circuit development library design limitations, such as memory access times, prevent memory access and generation of the trace-back bits in a manner that does not stall. Accordingly, a pipelined architecture is required to access memory, which is relatively slow, and register the memory contents for subsequent use by the trace-back circuit.

For the case where the constraint length k=7, the Viterbi decoder requires 32 Butterfly operations per stage (or input bit). Each stage of forward computation, results in the update of 64 path metrics and the generation of 64 survivor bits. When the Viterbi decoder (k=7) is implemented in a Reconfigurable Bit-manipulation Node (RBN), which is available as an ASIC (Application Specific Integrated Circuit) which is available from QuickSilver Technology, the assignee of the present invention and described in the pending patent application cited above, it is capable of performing 32 parallel butterfly computations in a single clock cycle. However, since it requires two cycles to store 64 bits in memory, the storing operation effectively takes two cycles to perform a forward stage so the butterfly units operate every other cycle.

Figure 6B:
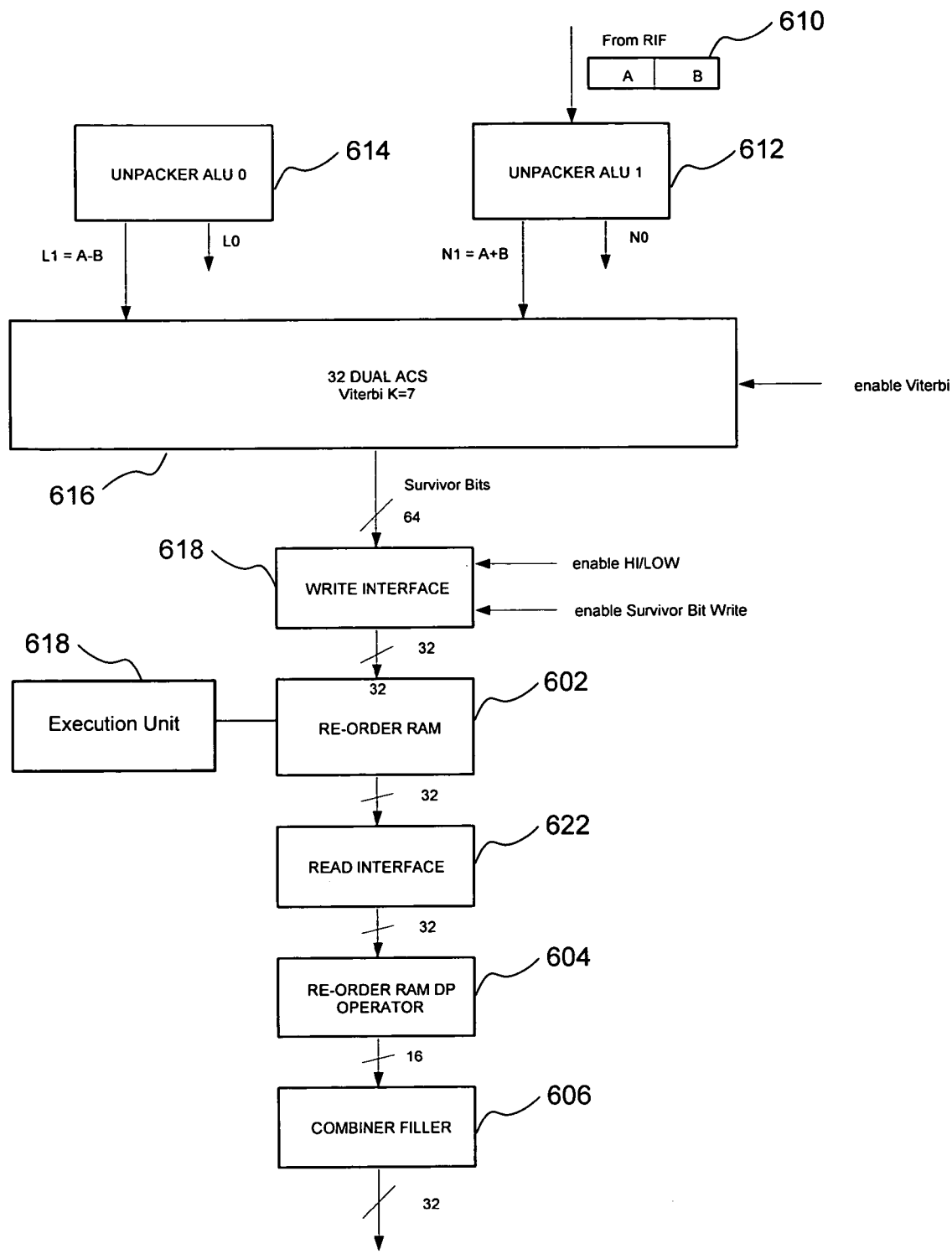
FIG. 6B illustrates the data-path elements for a Viterbi decoder in accordance with an embodiment of the present invention.

FIG. 6B illustrates a more detailed illustration of the data path for a Viterbi decoder (k=7 code) in an RBN 609. It consists of receiving data 610 by way of the memory read interface, and processing a pair of bytes (or nibbles or 16-bit words) through a pair of Unpacker/ALU units 612 and 614. The sum and difference of the data are then sent to dual 32 ACS units 616 to compute a 64 path metrics as well as 64 survivor bits. The path metrics are internally stored in registers within ACS units 616. However, the survivor path bits are routed to reorder RAM 602 via Write Memory Interface 618. Finally, when the path metrics are computed for a length equal to the trace-back length, a trace-back operation is performed by reading the decoded bits of reorder RAM 602 into the execution unit 620 of the RBN. The result is then packed into words in Combiner unit 606 by read interface 622 before being sent out to a PTP port (not shown).

The trace-back/decoding operation in RBN from one state to another, logic in the RBN is initialized with the address corresponding to the start of the trace-back window. The address is sequentially decremented (by 2 32-bit word steps) so that the memory read interface accesses the trace-back memory beginning at the start of the trace-back window. A trace bit is extracted from the accessed memory word accessed that represents the path to the previous state in the survivor path and does not represent the decoded bit. The trace bit is also used to determine the address computation of the survivor word four cycles later, that is, it will be logically combined (XOR) with the address four cycles later. This bit determines whether the address that will be computed four cycles later is an even or odd state. The least significant bit (LSB) of the address computed represents the decoded bit and is shifted into a register. When 16 bits are collected in the RBN, the word is then stored in an output register. Finally when all bits are decoded, corresponding to a programmable decoding length, the data is sent to the Combiner/Filler from the register in a Last In First Out (LIFO) fashion, that is, the last register that was written is read out first into the Combiner Filler. In the beginning of the trace-back operation, trace bits are read out of the Re-order RAM, without scheduling any data movement from the LSB of the address into the register, which allows for the convergence length interval.

Figures 7, 8:
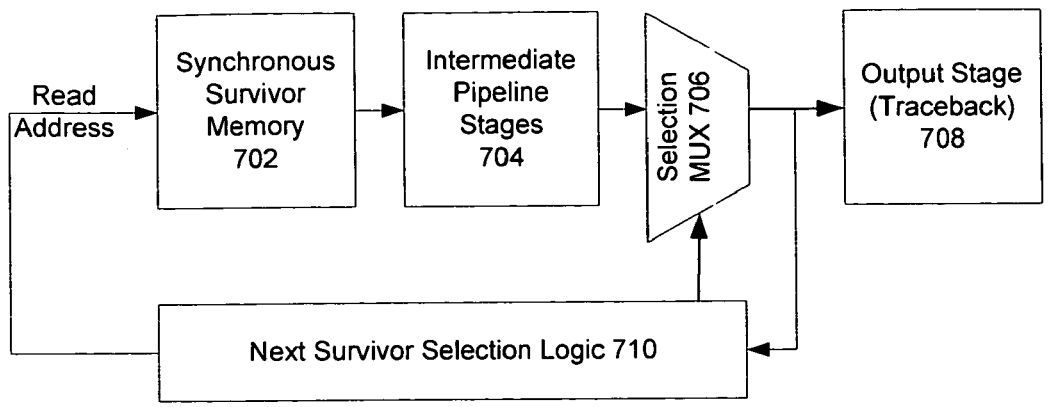
FIG. 7 is a simplified block diagram of the pipelined architecuture of a Viterbi decoder in accordance with an embodiment of the present invention.
FIG. 8 illustrates a memory organization for a single pipeline architecture Viterbi decoder in accordance with an embodiment of the present invention.
Figure 11:
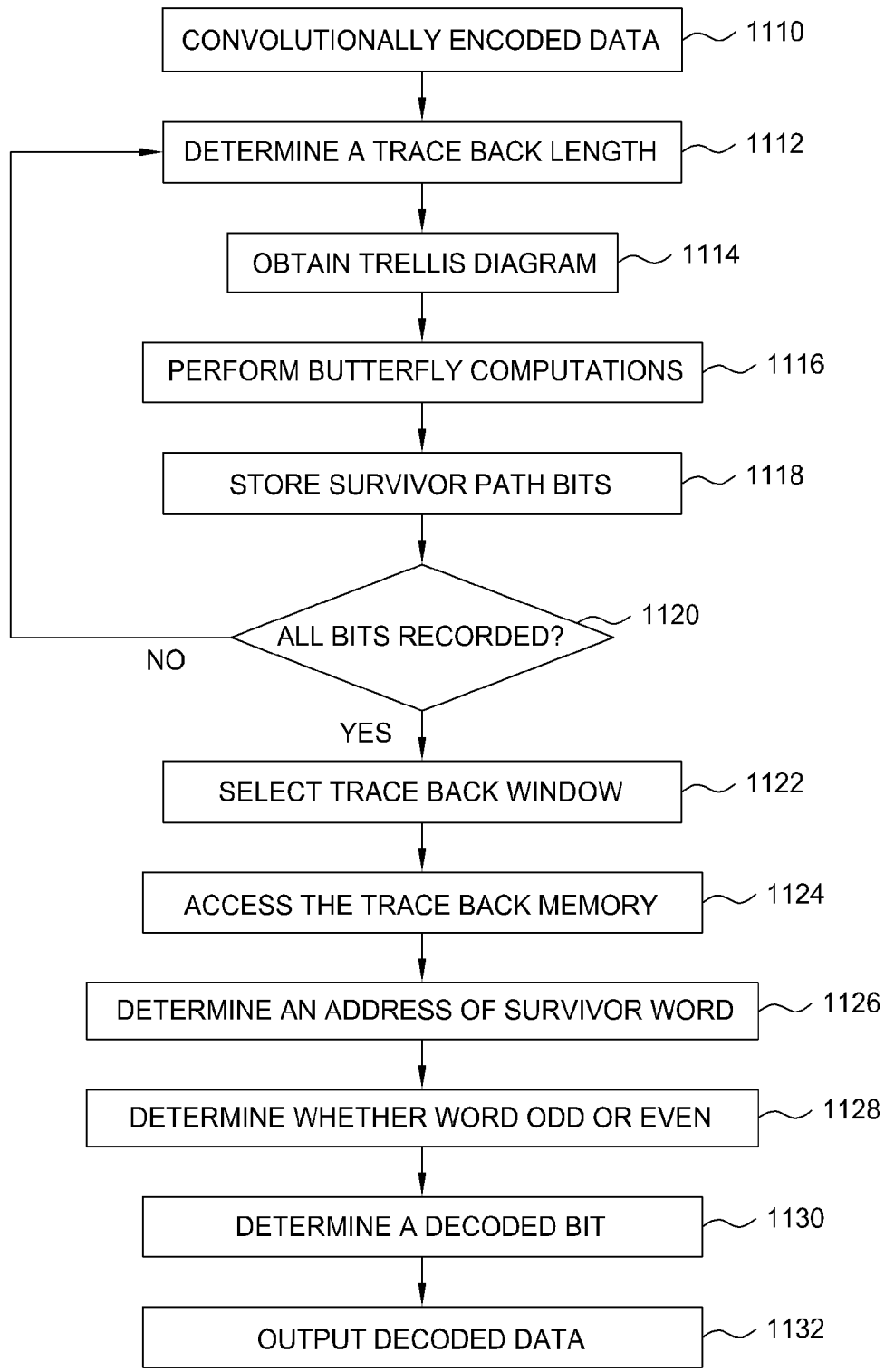
FIG. 11 illustrates convolutionally encoded data in accordance with an embodiment of the present invention.

Refer now to FIG. 7, which shows a pipelined trace-back unit in accordance with the present invention. Due to system timing constraints and available technology, it is necessary to pipeline the survivor read path rather than implement an ideal trace-back unit. The pipelined trace-back unit includes synchronous survivor memory 702 containing survivor bits, which provide a history of the most likely transitions into every given state for each input sample. The survivor memory write circuitry stores the survivor bits in accordance with the final state ordering of the code tree (FIG. 3) and not in the standard ordinal format. This history is provided to an intermediate pipeline stage 704 so that the access time associated with retrieving a memory location from the synchronous memory does not limit the amount of time available to compute the trace-back bit. Thus, with pipeline stage 704, decoder 112 may operate at a much higher clock rate compared to a decoder that had to access memory and perform the trace-back computations in the same clock cycle.

The insertion of pipeline stages along the survivor selection path requires careful management of the next survivor bit selection logic. Obviously, if the survivor memory is actually $2^{(k-1)}+1$ bits wide then it is sufficient to pipeline adjust the mux selector so that it lines up with the appropriate data word. However, when the survivor bits are distributed across multiple memory words, the memory read address must also be adjusted to account for the data pipeline.

Rather than accept the conventional wisdom that the pipeline will result in performance degradation of the trace-back phase, the present invention assumes that with two pipeline stages, the present invention selects a cutout or portion of the code trellis. Memory is then organized into several trellis cutouts that provide a memory trellises and organizing memory based upon the sub-trellises may require the memory to expand in order to accommodate duplication of states.

The output of pipeline stage 704 is provided to a selection multiplexor (Mux) 706. The output of the mux is provided to an output stage 708 and to a next survivor selection logic 710. The trace-back survivor bit selection mux control is a left shift of the previous survivors. The memory address selection is a left shift with the most significant bit (MSB) of the mux selector, feeding bit zero of the address of the word address. The output phase input bit is simply the least significant bit (LSB) of the word address.

In operation, a 32-bit memory word is loaded into the pipeline register. This word is then transferred to the mux and one bit is selected as representing the most likely path. However, because of the inserted pipeline, the data out of the memory is no longer in sync with the selection process. The first word generates an address back into the memory. One cycle after that, the word designated by the address must be in the mux and that word is then going to be shifted and used as the selector of the next word to come out of memory. However, there is now a loss of synchronization due to the addition of the pipeline. Compounding the problem is the fact that memory must be accessed twice resulting in the output data rate being reduced by a factor of two. Rather than accept the fact there will be stalls due to the lack of knowledge of the trace-back path and system parameters, the pipeline and the memory re-organization eliminates stalling so that the decoder does not need to shut down until it can perform the necessary computations.

By modifying the ideal system slightly the complexity of the survivor memory read address generation is increased but the memory width is reduced as is the size of the output mux, that is from a 64 to 1 mux to a 32 to 1 mux. In this modification, the survivor bits are not stored in one long memory word but rather stored across multiple smaller memory words, the trace-bit is involved in the memory address generation, and the delayed versions of the trace-bit control the mux.

Like the selector, the read address must also be delayed to equalize the pipeline skew. However delaying the memory read address results in lowered performance of the trace-back phase reducing the output rate. Data throughput and integrity is maintained in the presence of survivor path pipelining by exploiting certain properties of the code tree. Specifically, since each state can only exit to one of two other states or be entered from one of two other states, regardless of the complete path to that state, the code tree actually wraps back upon itself. Furthermore, from any arbitrary starting state, the same ordered set of possible end states is reached after k–1 iterations due to the nature of the code tree. As shown in the code tree (FIG. 3), when an initial branch is taken, then a set of states is no longer valid. Thus, only a limited subsection of the trellis/tree is valid once a transition is chosen. Accordingly, it is possible to account for the pipeline delay by organizing the survivor memory in a specific manner based upon the properties of the code tree so that the number of memory words is reduced from two to one for each access.

In summary, what is disclosed herein and specifically described in the code beginning at paragraph [0062] is a method for implementing a decoder based on a pipelined architecture which includes the steps of receiving convolutionally encoded data 1110 and generating a tree for that encoded data. The convolutionally encoded data is then decoded for each received bits by determining a trace-back length at 1112 obtaining a trellis diagram for the convolutional encoded that generated the encoded received data stream 1114. For each bit and set that received data stream, the plurality of forward butterfly computations determines survivor path bits 1116. For each butterfly computation the resulting survivor path bits for each state are stored in a trace-back memory 1118. The above steps 1110-1118 are repeated until all bits in the encoded received data stream have been recorded 1120. When the bits have been decoded and recorded, a trace-back window is selected 1122. The method then sequentially decumbence by two 32 bit word steps to access the trace-back memory 1124. A trace bit is used to perform a look at function to determine a computed address of a future survivor word 1126. The future survivor word is then determined to be in an odd or even state 1128. A decoded bit is then determined from a computed address 1130. The decoded data stream corresponding to the encoded received data stream is then output 1132.

With a single pipeline stage, partitioning the memory in accordance with FIG. 8 maintains data integrity while enhancing the throughput rate. For deeper pipeline scenarios an optimal subsection of the tree should be able to be chosen, however due to the complexity of finding the optimal subsection, it is recommended to instead organize the memory based on the final state such as is illustrated in FIGS. 9 and 10. When organized along the lines of the final state distribution up to k pipeline stages may be accounted for. Effectively, this approach pushes the impact of the selected survivor bit from immediate memory address generation (the MSB of the selection word) to a two-to-one selection on the next survivor word in the pipeline. Now the last survivor bit operates on the next word at the final selector and not on the memory fetch, so there is no need to pipeline or stall the selection. The impact of the survivor bit on the memory address is delayed by k cycles since this is the depth of the tree and is where the decision point leading to the last survivor state was passed.

The following program executes on a circuit node that implements a Viterbi decoding algorithm on the fly and which is described in U.S. patent application Ser. No. 10/683,563 entitled "RECONFIGURABLE BIT-MANIPULATION NODE," which describes an execution unit for executing program code and a number of elements interconnected with one another to allow bit-oriented functions to be performed. The elements include a programmable butterfly unit, a number of non-programmable butterfly units, a number of data path elements, a look-up-table memory and a reorder memory.

```
;This is a DBN program of a Viterbi(k=7) decoder.
;There are 64 trace-back bits. It takes 2 cycles to write those bits ;into reorder ram
write interface.
;Group 1: trace-back bits {62, 30, 46, 14, 54, 22, 38, 6,58, 26, 42, ;10, 50, 18, 34,
2,60, 28, 44, 12, 52, 20, 36, 4,56, 24, 40, 8, 48, 16, ;32, 0},
;Group 2: trace-back bits {63, 31, 47, 15, 55, 23, 39, 7,59, 27, 43, ;11, 51, 19, 35,
3,61, 29, 45, 13, 53, 21, 37, 5,57, 25, 41, 9, 49, 17, ;33, 1}}
        .miconfig
    rmi[2][0]sb dag[1][0] + s 16
    rdag[1][0] size=200h base=0h max=200h step=1 tc=ffffh 1p0
    rmi[3][0]sb dag[2][0] − s 32
    rdag[2][0] size=200h base=0h max=0h step=0xfffe tc=ffffh 1p0
    wmi[3][0] sb dag[2][0] + s 32
    wdag[2][0] size=200h base=0h max=200h step=2 tc=ffffh 1p0
    wmi[1][0] sb dag[3][0] + s 32
    wdag[3][0] size=200h base=0h max=200h step=2 tc=ffffh 1p0
    .end
    .init
        0x0026 0x0105           ; Set viterbi control mode to wide viterbi
    0x040 0xf0f0                ; FPG#1 wide viterbi mux selectors {S1, S0}[7:0]
    0x041 0xf0f0                ; FPG#1 wide viterbi mux selectors {S1, S0}[15:8]
    0x042 0xf0f0                ; FPG#1 wide viterbi mux selectors {S1, S0}[23:16]
    0x043 0xf0f0                ; FPG#1 wide viterbi mux selectors {S1, S0}[31:24]
    0x044 0x0f0f                ; FPG#1 wide viterbi mux selectors {S1, S0}[39:32]
    0x045 0x0f0f                ; FPG#1 wide viterbi mux selectors {S1, S0}[47:40]
    0x046 0x0f0f                ; FPG#1 wide viterbi mux selectors {S1, S0}[55:48]
    0x047 0x0f0f                ; FPG#1 wide viterbi mux selectors {S1, S0}[63:56]
    0x048 0x9669                ; FPG#1 wide viterbi tog selectors {T1, T0}[7:0]
    0x049 0x6996                ; FPG#1 wide viterbi tog selectors {T1, T0}[15:8]
    0x04A 0x9669                ; FPG#1 wide viterbi tog selectors {T1, T0}[23:16]
    0x04B 0x6996                ; FPG#1 wide viterbi tog selectors {T1, T0}[31:24]
    0x04C 0x9669                ; FPG#1 wide viterbi tog selectors {T1, T0}[39:32]
    0x04D 0x6996                ; FPG#1 wide viterbi tog selectors {T1, T0}[47:40]
```

-continued

```
0x04E 0x9669            ; FPG#1 wide viterbi tog selectors {T1, T0}[55:48]
0x04F 0x6996            ; FPG#1 wide viterbi tog selectors {T1, T0}[63:56]
; Datapath Settings
0x0B00 0x0000           ; Set pathmetric0 initial value
0x0B01 0xff80           ; Set pathmetric1 initial value
0x0B02 0xff80           ; Set pathmetric2 initial value
0x0B03 0xff80           ; Set pathmetric3 initial value
0x0B04 0xff80           ; Set pathmetric4 initial value
0x0B05 0xff80           ; Set pathmetric5 initial value
0x0B06 0xff80           ; Set pathmetric6 initial value
0x0B07 0xff80           ; Set pathmetric7 initial value
0x0B08 0xff80           ; Set pathmetric8 initial value
0x0B09 0xff80           ; Set pathmetric9 initial value
0x0B0a 0xff80           ; Set pathmetric10 initial value
0x0B0b 0xff80           ; Set pathmetric11 initial value
0x0B0c 0xff80           ; Set pathmetric12 initial value
0x0B0d 0xff80           ; Set pathmetric13 initial value
0x0B0e 0xff80           ; Set pathmetric14 initial value
0x0B0f 0xff80           ; Set pathmetric15 initial value
0x0B10 0xff80           ; Set pathmetric16 initial value
0x0B11 0xff80           ; Set pathmetric17 initial value
0x0B12 0xff80           ; Set pathmetric18 initial value
0x0B13 0xff80           ; Set pathmetric19 initial value
0x0B14 0xff80           ; Set pathmetric20 initial value
0x0B15 0xff80           ; Set pathmetric21 initial value
0x0B16 0xff80           ; Set pathmetric22 initial value
0x0B17 0xff80           ; Set pathmetric23 initial value
0x0B18 0xff80           ; Set pathmetric24 initial value
0x0B19 0xff80           ; Set pathmetric25 initial value
0x0B1a 0xff80           ; Set pathmetric26 initial value
     0x0B1b 0xff80           ; Set pathmetric27 initial value
0x0B1c 0xff80           ; Set pathmetric28 initial value
0x0B1d 0xff80           ; Set pathmetric29 initial value
0x0B1e 0xff80           ; Set pathmetric30 initial value
0x0B1f 0xff80           ; Set pathmetric31 initial value
0x0B20 0xff80           ; Set pathmetric32 initial value
0x0B21 0xff80           ; Set pathmetric33 initial value
0x0B22 0xff80           ; Set pathmetric34 initial value
0x0B23 0xff80           ; Set pathmetric35 initial value
0x0B24 0xff80           ; Set pathmetric36 initial value
0x0B25 0xff80           ; Set pathmetric37 initial value
0x0B26 0xff80           ; Set pathmetric38 initial value
0x0B27 0xff80           ; Set pathmetric39 initial value
0x0B28 0xff80           ; Set pathmetric40 initial value
0x0B29 0xff80           ; Set pathmetric41 initial value
0x0B2a 0xff80           ; Set pathmetric42 initial value
     0x0B2b 0xff80           ; Set pathmetric43 initial value
0x0B2c 0xff80           ; Set pathmetric44 initial value
0x0B2d 0xff80           ; Set pathmetric45 initial value
0x0B2e 0xff80           ; Set pathmetric46 initial value
0x0B2f 0xff80           ; Set pathmetric47 initial value
0x0B30 0xff80           ; Set pathmetric48 initial value
0x0B31 0xff80           ; Set pathmetric49 initial value
0x0B32 0xff80           ; Set pathmetric50 initial value
0x0B33 0xff80           ; Set pathmetric51 initial value
0x0B34 0xff80           ; Set pathmetric52 initial value
0x0B35 0xff80           ; Set pathmetric53 initial value
0x0B36 0xff80           ; Set pathmetric54 initial value
0x0B37 0xff80           ; Set pathmetric55 initial value
0x0B38 0xff80           ; Set pathmetric56 initial value
0x0B39 0xff80           ; Set pathmetric57 initial value
0x0B3a 0xff80           ; Set pathmetric58 initial value
     0x0B3b 0xff80           ; Set pathmetric59 initial value
0x0B3c 0xff80           ; Set pathmetric60 initial value
0x0B3d 0xff80           ; Set pathmetric61 initial value
0x0B3e 0xff80           ; Set pathmetric62 initial value
0x0B3f 0xff80           ; Set pathmetric63 initial value
     ;read dag3 address out
     0x244 0xa4
     .end
;Compute stage
;**************************************************************
;
     ;0
     enable rif2[0]          ;enable read interface 2
     ;1
     enable rf0              ;delay cycle, dummy instruction.
     ;2
     enable rif2[0]          ;enable read interface 2
     ;3
```

-continued

```
        copy rif2[0] -> u1           ;read value from read interface 2
     ;4
        enable rif2[0]               ;enable read interface 2
        ||add u1.lh u1.ll -> au0
        ||sub u1.lh u1.ll -> au1
     ;5
        copy rif2[0] -> u1           ;read value from read interface 2
        ||enable viterbi             ;enable MAX
     ;6
        enable rif2[0]               ;enable read interface 2
        add u1.lh u1.ll -> au0
        ||sub u1.lh u1.ll -> au1
        ||loopstart #83
     ;7
        copy rif2[0] -> u1           ;read value from read interface 2
        ||enable viterbi             ;enable MAX
        ||enable wsurv               ;set the load hi bit, write trace-back bits
                                     ;group 1 to memory
        ||enable wif3[0]             ;enable write interface 3
     ;8
     enable rif2[0]                  ;enable read interface 2
     ||add u1.lh u1.ll -> au0
     ||sub u1.lh u1.ll -> au1
     ||enable wif3[0]                ;enable write interface 3
     ||loopend
     ;Compute + Read Stage
;******************************************************************
     loopstart #10
     ;9
        copy rif2[0] -> u1           ;read value from read interface 2
        ||enable viterbi             ;enable MAX
        ||enable wsurv               ;set the load hi bit, write trace-back bits
                                     ;group 1 to memory
        ||enable wif3[0]             ;enable write interface 3
     ||enable rif3[0]
        ;A
          add u1.lh u1.ll -> au0
        ||sub u1.lh u1.ll -> au1
        ||enable wif3[0]             ;enable write interface 3
        ||enable rif3[0]
        ||loopend
     ;Compute End + Read Stage
;******************************************************************
     ;B
        copy rif2[0] -> u1           ;read value from read interface 2
        ||enable viterbi             ;enable MAX
        ||enable wsurv               ;set the load hi bit, write trace-back bits
                                     ;group 1 to memory
        ||enable wif3[0]             ;enable write interface 3
        ||enable rif3[0]
     ;C
     enable wif3[0]                  ;enable write interface 3
     ||enable rif3[0]
     ||add u1.lh u1.ll -> au0
     ||sub u1.lh u1.ll -> au1
     ;D
        enable viterbi               ;enable MAX
        ||enable wsurv               ;set the load hi bit, write trace-back bits
                                     ;group 1 to memory
        ||enable wif3[0]             ;enable write interface 3
        ||enable rif3[0]
     ;E
     enable wif3[0]                  ;enable write interface 3
     ||enable rif3[0]
     ;F
        enable wsurv                 ;set the load hi bit, write trace-back bits
                                     ;group 1 to memory
        ||enable wif3[0]             ;enable write interface 3
        ||enable rif3[0]
     ;10
     enable wif3[0]                  ;enable write interface 3
     ||enable rif3[0]
     ||loopstart #9
     ;Read only stage
;******************************************************************
     ;11
     enable rif3[0]
     ||loopend;
       goto out
```

```
;Out stage
;********************************************************
;12
out:
    enable rf1;                         ;delay cycle, dummy instruction
;13
    enable rif3[0]                      ;enable read interface 3
;14
    enable rif3[0]                      ;enable read interface 3
;15
    enable rif3[0]                      ;enable read interface 3
    ||loopstart #16
;16
enable rif3[0]                          ;enable read interface 3
||shram rif3[0] -> rrp.lsb ;1 bit shift left
||loopend
;17
enable rif3[0]                          ;enable read interface 3
||shram rif3[0] -> rrp.lsb ;1 bit shift left
||copy rrp -> rf0
||loopstart #15
;18
    enable rif3[0]                      ;enable read interface 3
||shram rif3[0] -> rrp.lsb ;1 bit shift left
||loopend
;19
enable rif3[0]                          ;enable read interface 3
||shram rif3[0] -> rrp.lsb ;1 bit shift left
||copy rrp -> rf1
||loopstart #15
;1A
    enable rif3[0]                      ;enable read interface 2
||shram rif3[0] -> rrp.lsb ;1 bit shift left
||loopend
;1B
copy rrp -> rf2
;1C
enable rf2;
;1A
enable rf1;
||copy rf2 -> cf.16;
;1B
enable rf0
||copy rf1 -> cf.16
||copy cf -> wif1[0];
;1C
copy rf0 -> cf.16
||copy cf -> wif1[0];
;1D
copy cf -> wif1[0];
    return;
```

Although the invention has been described with respect to specific embodiments thereof, these embodiments are merely illustrative, and not restrictive of the invention. For example, the encoder may be of any constraint length. Further, the system memory type may be static RAM, Flash, or some other type of memory. Further still, hardware components may be implemented by software algorithms and program routines may be implemented in hardware.

The encoder and the Viterbi decoder both typically operate in a system having a "processor" or "process" that includes any human, hardware and/or software system, mechanism or component that processes data, signals or other information. A processor can include a system with a general-purpose central processing unit, multiple processing units, dedicated circuitry for achieving functionality, or other systems. Processing need not be limited to a geographic location, or have temporal limitations. For example, a processor can perform its functions in "real time," "offline," in a "batch mode," etc. Portions of processing can be performed at different times and at different locations, by different (or the same) processing systems.

The system and method may be implemented in any suitable programming language can be used to implement the routines of the present invention including C, C++, Java, assembly language, etc. Different programming techniques can be employed such as procedural or object oriented. The routines can execute on a single processing device or multiple processors. Although the steps, operations or computations may be presented in a specific order, this order may be changed in different embodiments. In some embodiments, multiple steps shown as sequential in this specification can be performed at the same time. The sequence of operations described herein can be interrupted, suspended, or otherwise controlled by another process, such as an operating system, kernel, etc. The routines can operate in an operating system environment or as stand-alone routines occupying all, or a substantial part, of the system processing.

In the description herein, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

As used herein "memory" for purposes of embodiments of the present invention may be any medium that can contain, store, communicate, propagate, or transport the program for use by or in connection with the instruction execution system, apparatus, system or device. The memory can be, by way of example only but not by limitation, an electronic, magnetic, optical, electromagnetic, infrared, or semiconductor system, apparatus, system, device, propagation medium, or computer memory.

Reference throughout this specification to "one embodiment," "an embodiment," or "a specific embodiment" means that a particular feature, structure, or characteristic described in connection with the embodiment is included in at least one embodiment of the present invention and not necessarily in all embodiments. Thus, respective appearances of the phrases "in one embodiment," "in an embodiment," or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

Embodiments of the invention may be implemented by using a programmed general purpose digital computer, by using application specific integrated circuits, programmable logic devices, field programmable gate arrays, optical, chemical, biological, quantum or nanoengineered systems, components and mechanisms may be used. In general, the functions of the present invention can be achieved by any means as is known in the art. Distributed, or networked systems, components and circuits can be used. Communication, or transfer, of data may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope of the present invention to implement a program or code that can be stored in a machine-readable medium to permit a computer to perform any of the methods described above.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being included, where terminology is foreseen as rendering the ability to separate or combine.

As used in the description herein and throughout the claims that follow, "a," "an," and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims.

What is claimed is:

1. A digital processing system comprising a pipelined architecture for decoding convolutional encoded data comprising:
   circuit means for performing branch metrics calculations;
   circuit means for performing path metrics calculations;
   survivor storage for retaining survivor bits indicating a preferred path through a tree;
   a pipeline register for receiving a word of survivor bits from said survivor storage; and
   a trace-back circuit for selecting a tree path and for determining a next address in said survivor storage of a trace bit, the trace back circuit including means for compensating for a delay introduced by said pipeline register by adjusting the memory read address, wherein the survivor bits are stored across multiple memory words, each of the trace bits being used to address one of the multiple memory words.

2. The digital processing system of claim 1 wherein said compensating means comprises storage of said survivor bits in a non-ordinal sequence.

3. The digital processing system of claim 1 wherein said compensating means comprises storage of said survivor bits based on an optimized subsection of said tree.

4. The digital processing system of claim 1 wherein said compensating means comprises storage of said survivor bits based on a final state distribution.

5. The digital processing system of claim 1 wherein the selection of a survivor bit includes addressing a word from said survivor storage for transfer to said pipeline register.

6. The digital processing system of claim 1 wherein said pipeline comprises a single stage and said memory is organized into two 32 bit memory words.

7. The digital processing system of claim 1 wherein said pipeline comprises a single stage and said memory is organized into a first word for storing the first 16 bits and bits 32-47 and a second word for storing bits 16-31 and bits 48-63.

8. The digital processing system of claim 1 wherein the survivor bits represents a portion of the path in the survivor path but does not represent a decoded bit of the data.

9. digital processing system of claim 1 wherein the trace back circuit extracts trace bits from the word of survivor bits, each of the trace bits determining the address computation of the survivor word for a later cycle, and whether the address to be computed if cycles later is an even or odd state.

10. The digital processing system of claim 1 wherein said pipeline comprises a single stage and said memory is organized into an even word and an odd word, the survivor bits for all even states being stored in an even addressed word and the survivor bits for all odd states being stored in an odd addressed word.

11. The digital processing system of claim 10 wherein said even word corresponds to the following states: 0, 32, 16, 48, 8, 40, 24, 56, 4, 36, 20, 52, 12, 44, 28, 60, 2, 34, 18, 50, 10, 42, 26, 58, 6, 38, 22, 54, 14, 46, 30 and 62.

12. The digital processing system of claim 10 wherein said odd word corresponds to the following states: 1, 33, 17, 49, 9, 41, 25, 57, 5, 37, 21, 53, 13, 45, 29, 61, 3, 35, 19, 51, 11, 43, 27, 59, 7, 39, 23, 55, 15, 47, 31, and 63.

13. A method for obtaining the maximum likelihood sequence estimate of bits in a data stream from a convolutionally encoded received data stream comprising the steps of:
Performing the following steps for each received bit in said encoded received data stream:
 a. Determining a trace-back length;
 b. Obtaining a Trellis diagram of the convolutional encoder that generated said encoded received data stream;
 c. For each bit in said received data stream, perform a plurality of forward butterfly computations to determine survivor path bits;
 d. For each butterfly computation, storing the resulting survivor path bits for each state in a trace-back memory;
 e. For each butterfly computation, updating path metrics for a pair of states and generating a pair of survivor bits; and
 f. Repeating steps a-f for each bit until all bits in the encoded received data stream have been recorded;
Selecting a trace-back window;
Sequentially decrementing by a 2 32-bit word steps to access a trace-back memory;
Extracting a trace bit to perform a look-ahead function to determine a computed address of a future survivor word;
Determining whether said future survivor word is an even or odd state;
Determining a decoded bit from said computed address; and
Outputting an decoded data stream corresponding to said encoded received data stream.

14. The method of claim 13 wherein the information stored in said trace-back memory is partitioned.

15. The method of claim 14 wherein the parameters of said encoder are: rate (r) where r=½; constraint length (k) where k-7; and generator polynominals $g_0=133|_8$ and $g_1=171|_8$.

16. The method of claim 14 wherein the said encoders has a rate (r) where r=½ and a constraint length (k), where k=9.

17. The method of claim 14 wherein the information stored in said trace-back memory is partitioned into an even partition and an odd partition.

18. The method of claim 17 wherein said memory partitions correspond to a code tree.

19. The method of claim 17 wherein the constraint length (k) of said encoder is an odd integer.

20. A method for implementing a Viterbi decoder including a pipelined architecture comprising the steps of:
Receiving convolutionally encoded data;
Generating a tree for said encoded data;
Calculating branch metrics;
Calculating path metrics to determine survivor bits indicating a preferred path through the tree;
Retaining said survivor bits in a survivor storage comprising a pipeline register;
Selectively accessing words in said survivor storage using a look-ahead pipeline in the pipelined architecture;
selecting a tree path for determining a next address in said survivor storage of a trace bit based on one or more of the survivor bits; and
compensating for a delay introduced by said pipeline register by adjusting the memory read address wherein the survivor bits are stored across multiple memory words, each of the trace bits being used to address one of the multiple memory words and access the addressed memory word.

21. The method of claim 20 wherein the information stored in said trace-back memory is portioned into an even partition and an odd partition.

22. The method of claim 21 wherein said memory partitions correspond to a tree.

23. The method of claim 20 wherein the information stored in said trace-back memory is partitioned.

24. The method of claim 23 wherein the parameters of said encoder are: rate (r) where r=½; constraint length (k) where k-7; and generator polynominals $g_0=133|_8$ and $g_1=171|_8$.

25. The method of claim 23 wherein the said encoders has a rate (r) where r-½ and a constraint length (k) where k=9.

26. A method for implementing a Viterbi decoder, including a pipeline register, that maintains data throughput and integrity by organizing a memory for storing survivor bits to account for pipeline delay where said organization is based upon the properties of the code tree comprising the steps of:
Receiving convolutionally encoded data;
Decoding said received convolutionally encoded data including the steps of;
generating a tree for said encoded data:
calculating branch metrics;
calculating path metrics to determine survivor bits indicating a preferred path through the tree:
retaining said survivor bits in a survivor storage comprising a pipeline register;
selectively accessing words in said survivor storage using a look-ahead pipeline in the pipelined architecture;
selecting a tree path for determining a next address in said survivor storage of a trace bit based on one or more of the survivor bits;
compensating for a delay introduced by said pipeline register by adjusting the memory read address, wherein the survivor bits are stored across multiple memory words, each of the trace bits being used to address one of the multiple memory words and access the addressed memory word; and
outputting data corresponding to said received convolutionally encoded data.

27. The method of claim 26 wherein said memory is organized so that the storage of survivor bits is in a non-ordinal sequence.

28. The method of claim 26 wherein said memory is organized into an even word and an odd word, the survivor bits for all even states being stored in an even addressed word and the survivor bits for all odd states being stored in an odd addressed word.

29. The method of claim 26 wherein said even word corresponds to the following states: 0, 32, 16, 48, 8, 40, 24, 56, 4, 36, 20, 52, 12, 44, 28, 60, 2, 34, 18, 50, 10, 42, 26, 58, 6, 38, 22, 54, 14, 46, 30 and 62.

30. The method of claim 26 wherein said pipeline comprises a single stage and said memory is organized into a first word for storing the first 16 bits and bits 32-47 and a second word for string bits 16-31 and bits 48-63.

31. The method of claim 26 wherein said memory is organized so that the storage of said survivor bits is based on an optimized subsection of a code tree.

32. The method of claim 31 wherein said code tree is defined by the parameters of said encoder.

33. The method of claim 26 wherein said odd word corresponds to the following states: 1, 33, 17, 49, 9, 41, 25, 57, 5, 37, 21, 53, 13, 45, 29, 61, 3, 35, 19, 51, 11, 43, 27, 59, 7, 39, 23, 55, 15, 47, 31 and 63.

34. The method of claim 33 wherein said pipeline comprises a single stage and said memory is organized into two 32-bit memory words.

* * * * *

UNITED STATES PATENT AND TRADEMARK OFFICE
CERTIFICATE OF CORRECTION

PATENT NO. : 7,331,013 B1 Page 1 of 1
APPLICATION NO. : 10/784484
DATED : February 12, 2008
INVENTOR(S) : Rudosky et al.

It is certified that error appears in the above-identified patent and that said Letters Patent is hereby corrected as shown below:

In column 21, line 4, please replace "digital processing system" with --The digital processing system--

In column 21, line 55, please replace "an" with --a--

Signed and Sealed this

Twenty-ninth Day of July, 2008

JON W. DUDAS
*Director of the United States Patent and Trademark Office*